United States Patent [19]
Kwon

[11] Patent Number: 5,374,574
[45] Date of Patent: Dec. 20, 1994

[54] METHOD FOR THE FABRICATION OF TRANSISTOR

[75] Inventor: Ho Y. Kwon, Seoul, Rep. of Korea

[73] Assignee: Goldstar Electron Co., Ltd., Rep. of Korea

[21] Appl. No.: 156,008

[22] Filed: Nov. 23, 1993

[51] Int. Cl.$^5$ .......................................... H01L 21/265
[52] U.S. Cl. .......................................... 437/44; 437/40; 437/41; 437/45; 437/56; 437/57; 437/192; 437/203
[58] Field of Search ............... 437/40, 41, 44, 45, 437/56, 57, 89, 191, 192, 203, 34

[56] References Cited

U.S. PATENT DOCUMENTS

| | | | |
|---|---|---|---|
| 4,577,392 | 3/1986 | Peterson | 437/45 |
| 4,745,082 | 5/1988 | Kwon | 437/44 |
| 4,939,154 | 7/1990 | Shimbo | 437/41 |
| 4,948,745 | 8/1990 | Pfiester et al. | 437/57 |
| 4,997,778 | 3/1991 | Sim et al. | 437/40 |
| 5,082,794 | 1/1992 | Pfister et al. | 437/44 |
| 5,200,352 | 4/1993 | Pfiester | 437/34 |
| 5,238,859 | 8/1993 | Kamijo et al. | 437/44 |
| 5,270,234 | 12/1993 | Huang et al. | 437/45 |

Primary Examiner—Tom Thomas
Assistant Examiner—Kevin M. Picardat
Attorney, Agent, or Firm—Poms, Smith, Lande & Rose

[57] ABSTRACT

A method for fabricating a transistor having a lightly doped drain structure is disclosed. The method comprises the steps of: forming a gate insulating film over a first conductive semiconductor substrate; covering the gate insulating film with a gate layer and an insulating film for gate cap, in due order; forming an insulating film for mask over the insulating film for gate cap; applying an etch process to the insulating film for mask to remove a predetermined portion of the insulating film for mask; forming a pair of spacers at both sides of the etched portion of the insulating film for mask; implanting first conductive impurity ions; burying a first material layer in the etched portion of the insulating film for mask; removing the spacers; implanting second impurity ions at a low density to form two lightly doped regions in the semiconductor substrate; removing the first material; burying a second material layer in the etched portion of the insulating film for mask, again; removing the insulating film for mask; applying an etch process to the insulating film for gate cap and the gate layer by use of the second material layer as a mask to form a gate cap insulating film and a gate; and implanting a second conductive impurity ions at a high density to form a high density source region and a high density drain region.

17 Claims, 7 Drawing Sheets

METHOD FOR THE FABRICATION OF TRANSISTOR

BACKGROUND OF THE INVENTION

The present invention relates in general to a method for fabricating a transistor, more particularly to improvements in operation ability and switching time, along with a method for the fabrication of transistor having a lightly doped drain structure (hereinafter "LDD").

As the integration degree of semiconductor device is high, the size of the semiconductor device becomes miniaturized smaller and smaller in the submicron region. In order to satisfy the scale-down, new silicon fabrication technologies have been developed and advanced.

A method for fabricating a submicron semiconductor device is required to keep the device performance high as well as to secure the device reliability, keeping on scaling down the semiconductor device.

In particular, as this miniaturization proceeds toward higher integration density, physical limits are generated. For example, the degradation caused by hot carriers, a problem relating to the device reliability, has been one of the most serious problems.

In an effort to overcome this problem, there has been suggested a method for controlling the charge entrapped in an oxide film on an n− region which is a low density impurity region of the source and drain region having an LDD structure. In the above view point, an inverse-T type LDD (hereinafter "ITLDD") structure is disclosed in U.S. Pat. Nos. 4,907,048 and 4,963,054.

Hereinafter, the inverse-T gate structure is to be described along with the problems included therein for better understanding of the background of the present invention.

Referring initially to FIG. 1, there is illustrated process steps in the fabrication of an ITLDD transistor device proposed in aforementioned patents.

First, a photoresist pattern PR is deposited upon an oxide film 13 covering a polysilicon layer 12 which overlays a gate oxide film atop a p type semiconductor substrate as shown in FIG. 1A.

Subsequently, using the photoresist pattern as a mask, the oxide film 13 is removed and the polysilicon layer 12 is partially removed so as to leave a central trunk 12'. The polysilicon layer 12 is thinned to leave a layer of thin thickness, followed by the removal of the photoresist pattern PR, as shown in FIG. 1B.

FIG. 1C shows the process to implant an n type impurity at a low density through the thinned layer to form lightly doped n− regions 14 and 15.

Next, sidewall spacers 16 are formed at the both sides of the central trunk 12' by depositing an oxide film on the resulting structure and etching back it, as shown FIG. 1D.

As illustrated in FIG. 1E, the thinned layer of polysilicon which was formed when a gate was formed is then removed by means of an etch process which utilizes the spacers 16 as masks, leaving an inverse-T gate structure.

Finally, an n type impurity is implanted, as indicated by arrows, at a high density to form n+ regions 17 and 18 within the formed n− regions 14 and 15, the sidewall spacers 16 serving as masks to offset an n type impurity of high density. As a result, there is formed the source 14, 17 and drain 15, 18 of LDD structure.

In such ITLDD transistor device, since the n− regions 14 and 15 are formed in such a way to completely overlap with the gate to have influence on themselves, the immunity against hot carriers can be improved and thus, the device degradation caused by the hot carriers can be prevented.

However, this fabrication process includes a problem as indicated below. Following the formation of the polysilicon layer for gate, as introduced above, the polysilicon layer is subjected to an etch process to form an inverse-T shape with the gate mask. At this time, instead of removing the entire layer, it is etched so as to be left thin. Care must be taken so as not to overthin the conductive layer. In other words, it is very difficult to control the etch stop endpoint.

Referring now to FIG. 2, there is shown another inverse-T gate transistor device. This structure is to solve the problem of the etch stop endpoint which appears in fabricating an ITLDD gate transistor device of FIG. 1 and is disclosed in U.S. Pat. No. 5,082,794.

The inverse-T gate transistor device proposed in the just mentioned patent is formed of a p type semiconductor substrate 11 which is sectioned by field oxide films 12 into an active region 14 and an device separation region. The active region of the semiconductor substrate 20 is covered with an oxide film 16, followed by the formation of first polysilicon layer 17 over the resulting structure, as shown in FIG. 2A.

Upon the first polysilicon layer 17 is entirely deposited an oxide film 18 which is then subjected to an etch process by use of a mask (not shown) to provide a gate region, as shown in FIG. 2B. A p type impurity is ion-implanted, as indicated by arrow of FIG. 2B, to form a p type region 25 which plays a role in controlling a threshold voltage.

A second polysilicon 26 is buried in the etched portion of the oxide film by a selective chemical vapor deposition process, as shown in FIG. 2C.

The oxide film 18 is removed and then, using the second polysilicon layer 26 as a mask, an n type impurity is ion-implanted at a low density to form LDD regions 27 of n− region, as shown in FIG. 2D.

Next, a pair of oxide film spacers 31 are formed at both sides of the second polysilicon layer 25, followed by the formation of a high density n+ source 33 and a high density n+ drain region 34 by ion implantation of an n type impurity at a high density, as shown in FIG. 2E.

Using the second polysilicon layer 26 and the oxide film spacer 31 as a mask, the first polysilicon layer 26 is subjected to an etch process to form an ITLDD gate transistor, consequently.

The fabrication process illustrated in FIG. 2 is precise in fabricating an inverse-T gate as compared with that illustrated in FIG. 1. However, the ITLDD gate transistor is thicker than the transistor of FIG. 1 and thus, the device flatness, that is, the topography thereof becomes deteriorated.

In fabricating the ITLDD gate transistor, when an ion implantation process is carried out in order to form the source region and the drain region, a channeling phenomenon (the electric characteristics of transistor are changed by the result that ion dopants implanted penetrate into a gate, following after the polysilicon grains constituting the gate) may be generated. In addition, since the gate is formed by the selective chemical vapor deposition, the side surfaces of the gate may be not clear.

SUMMARY OF THE INVENTION

Therefore, an object of the present invention is to solve the aforementioned problems encountered in the prior arts and to provide a method for fabricating a transistor, improved in operational ability and switching time.

According to an aspect of the present invention, this object can be accomplished by providing a method for fabricating a transistor device, comprising the steps of: forming a gate insulating film over a first conductive semiconductor substrate; covering said gate insulating film with a gate layer and an insulating film for gate cap, in due order; forming an insulating film for mask over said insulating film for gate cap; applying an etch process to said insulating film for mask to remove a predetermined portion of said insulating film for mask; forming a pair of spacers at both sides of the etched portion of said insulating film for mask; implanting first conductive impurity ions; burying a first material layer in the etched portion of said insulating film for mask; removing said spacers; implanting second impurity ions at a low density to form two lightly doped regions in the semiconductor substrate; removing said first material; burying a second material layer in the etched portion of said insulating film for mask, again; removing said insulating film for mask; applying an etch process to said insulating film for gate cap and said gate layer by use of said second material layer as a mask to form a gate cap insulating film and a gate; and implanting a second conductive impurity ions at a high density to form a high density source region and a high density drain region.

The above and other objects and advantages of the present invention will become more apparent as the following description proceeds.

To the accomplishment of the foregoing and related ends, the invention, then, comprises the features hereinafter fully described in the specification and particularly pointed out in claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1A:
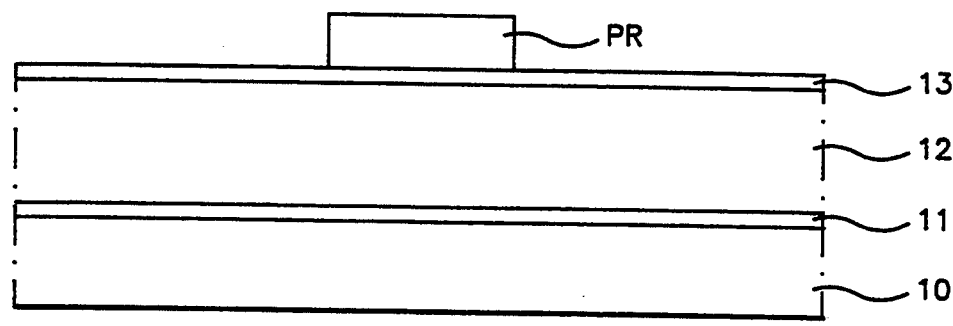
FIGS. 1A through 1F are schematic cross sectional views illustrating process steps in fabrication of conventional ITLDD gate device.

Hereinafter, the preferred embodiments of the present invention will be in detail described with reference to the accompanying drawings, wherein like reference numerals designate like parts.

FIG. 3 shows process steps for fabricating an LDD transistor device according to the present invention, in due order.

Figure 3A:
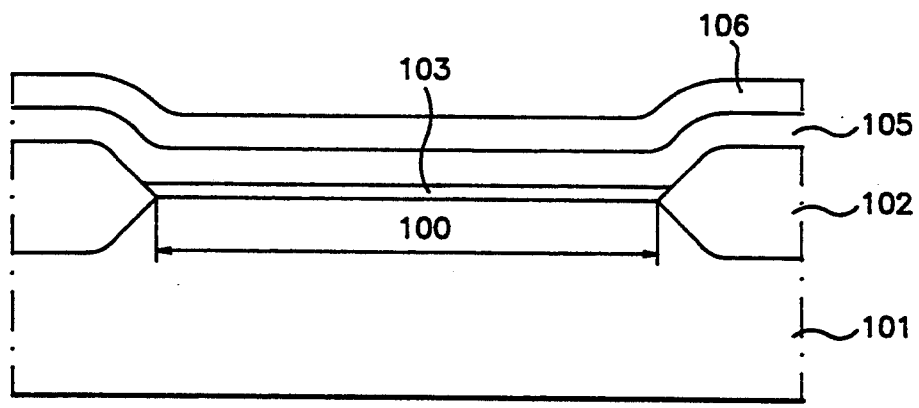
FIGS. 3A through 3H are schematic cross sectional views illustrating novel process steps in fabricating of device according to the present invention.
Figure 3B:
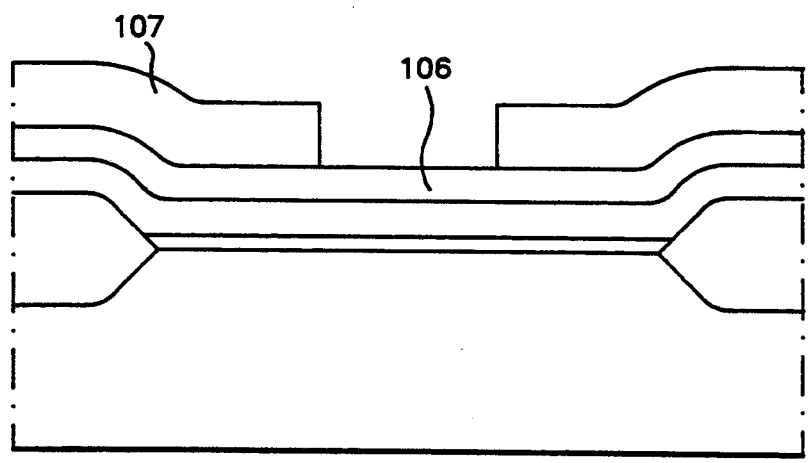
Figure 3C:
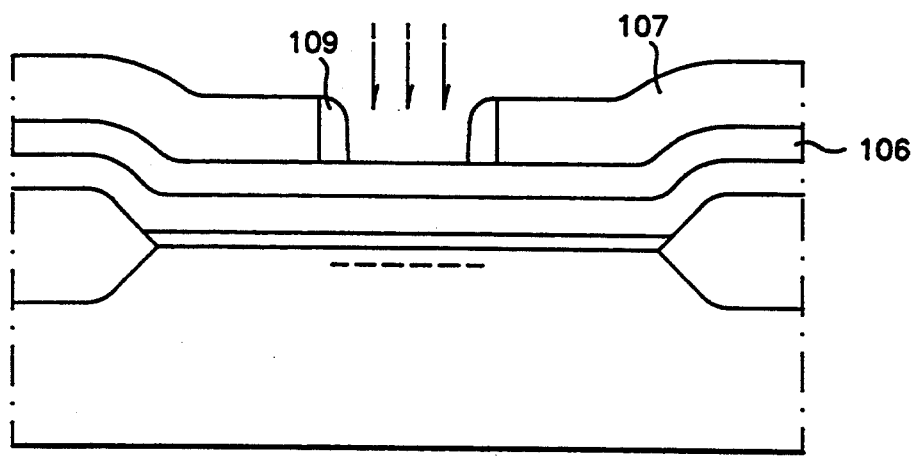
Figure 3D:
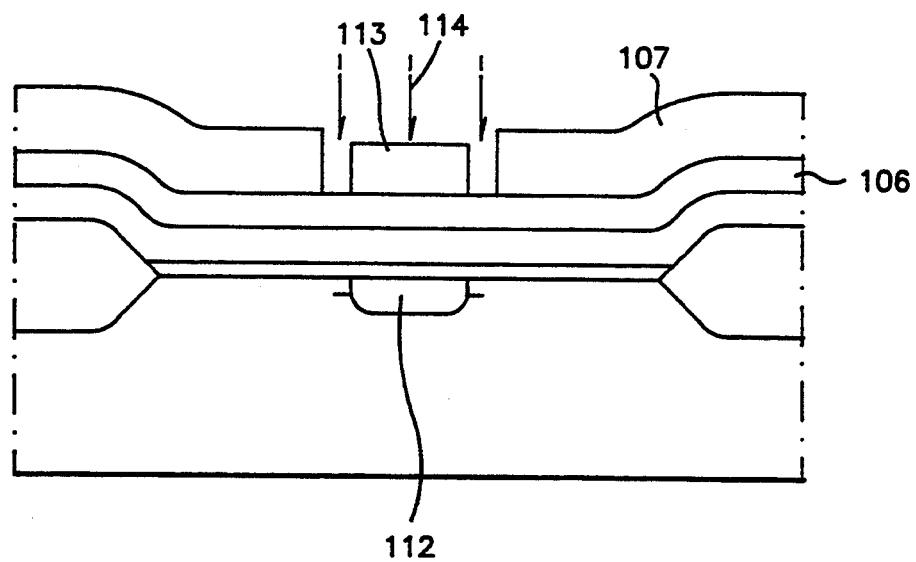

Firstly, as shown in FIG. 3A, an active region 100 is defined at a predetermined portion of a p type semiconductor substrate 101 by the application of general local oxidation of silicon (hereinafter "LOCOS") process, a device separation process, forming a field oxide film 102. Thereafter, on the active region 100 of the semiconductor substrate 101 is formed a gate insulating film 103 which is then covered with a polysilicon film 105 that is to form a gate. An oxide film 106 is entirely formed over the resulting structure in order to form a gate cap insulating film, later.

Figure 1B:
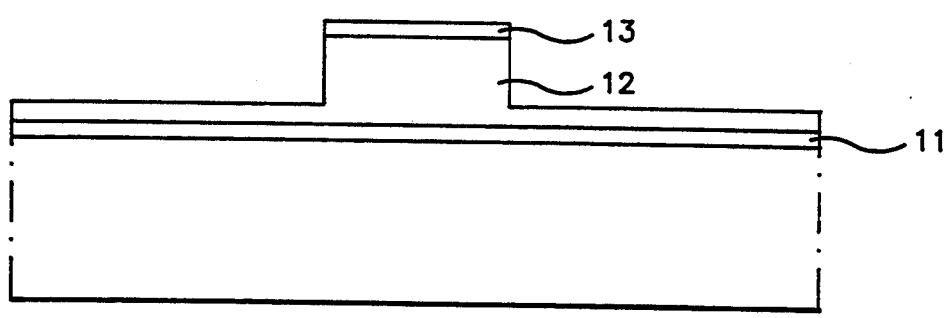

Subsequently, a nitride film is formed over the oxide film 106 and is then subjected to a selective etch process, so as to form an insulating film 107 serving to mask all portions but a region where the gate is to be formed, as shown in FIG. 1B.

Figure 1C:
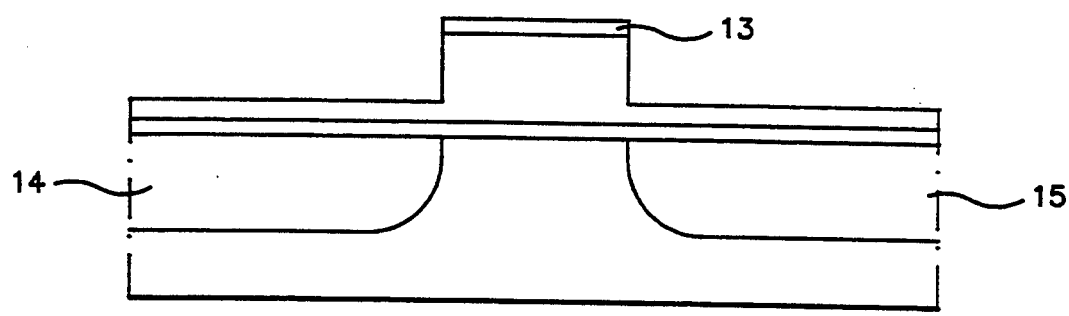

Next, a material for forming spacers, for example, a polysilicon is deposited on the resulting structure and then subjected to an etch back process so as to form a pair of spacers at the both wall sides of the insulating film 107 for mask etched, as shown in FIG. 1C. The spacers are formed of a material different from the insulating film 107 for mask. As mentioned above, while the insulating film 107 for mask is formed of nitride film, the spacers are formed of polysilicon. On the contrary, if the insulating film for mask is formed of polysilicon, the spacers may be formed nitride film.

The oxide film for forming the gate cap insulating film may not be formed. At this time, polysilicon or silicide along with polysilicon for forming the gate is deposited, followed by the formation of the insulating film for mask and the spacers as described above.

In this case, the insulating film for mask may be formed of nitride film and the spacers may be formed of oxide film, and vice versa.

The insulating film 107 for mask and the spacers 109 mask serve to mask all regions but a predetermined region which is to be a p type region when B or BF$_2$ as a p type impurity is implanted, as indicated by arrows 109 of FIG. 1C, in the p type substrate 101 through the polysilicon layer 105 and the oxide film 106. If necessary, an ion-implantation process may be carried out in order to stop the punch through.

Figure 1D:
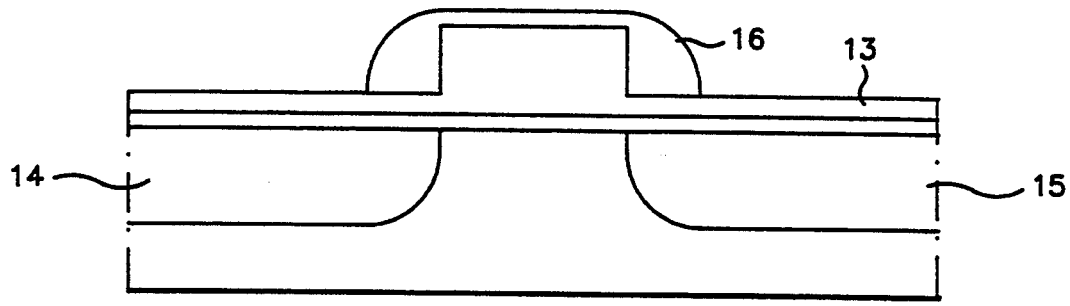
Figure 1E:
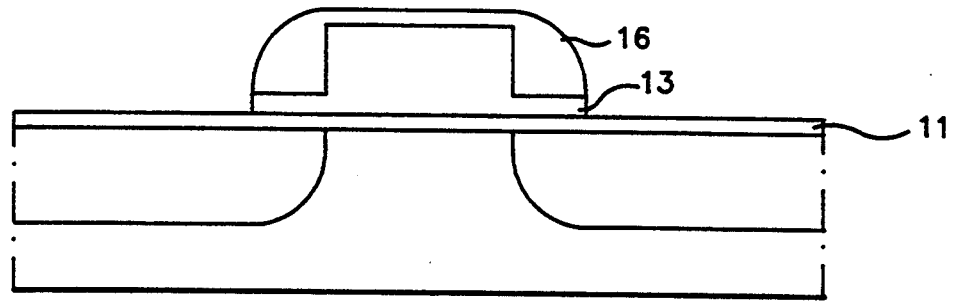
Figure 1F:
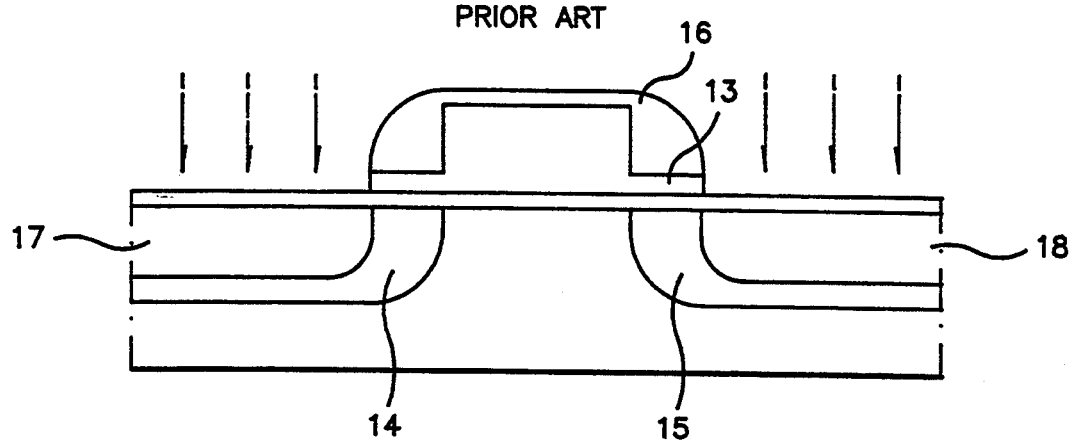

As a result of the ion implantation of p type impurity, a p type region 112 is formed in the semiconductor substrate, as shown in FIG. 1D. The region where the insulating film 107 for mask is selectively etched is filled with a first material by use of a photoresist and then, the spacers are removed, so as to form a first material layer 113. Thereafter, an n type impurity such as phosphorous or arsenic is ion-implanted at a low density through, as indicated by arrow 114 of FIG. 1D, in the p type substrate 101 through the polysilicon layer 105 and the oxide film 106.

Figure 3E:
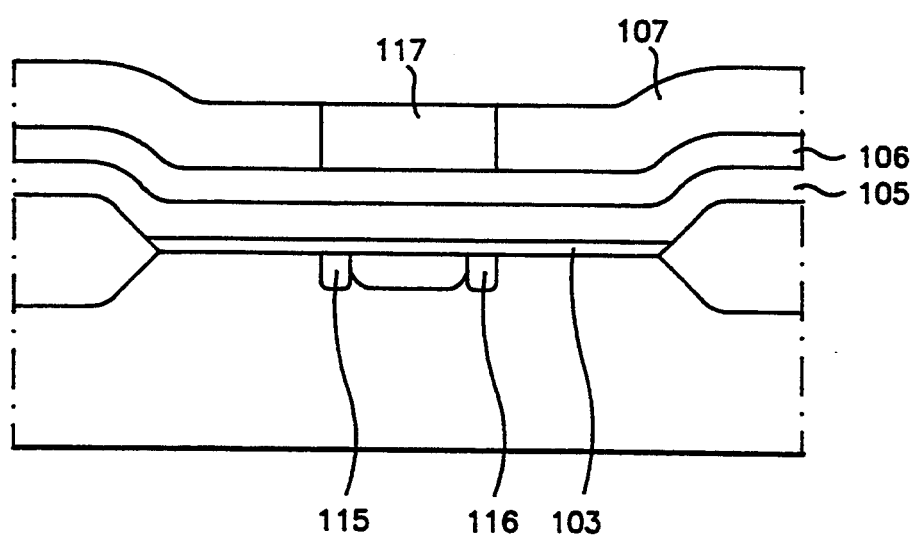

As a result of the ion implantation of n type impurity, LDD regions consisting of n$^-$ region 115 and 116 are formed as shown in FIG. 3E. The first material layer 113 to serve as a photoresist is removed and then, the region where the insulating film 107 for mask is selectively etched is filled with a second material by use of a photoresist to form a second material layer 117. At this time, the second material layer 117 is formed of a material different from the materials for the oxide film 106 and the insulating film 107 for mask.

Figure 3F:
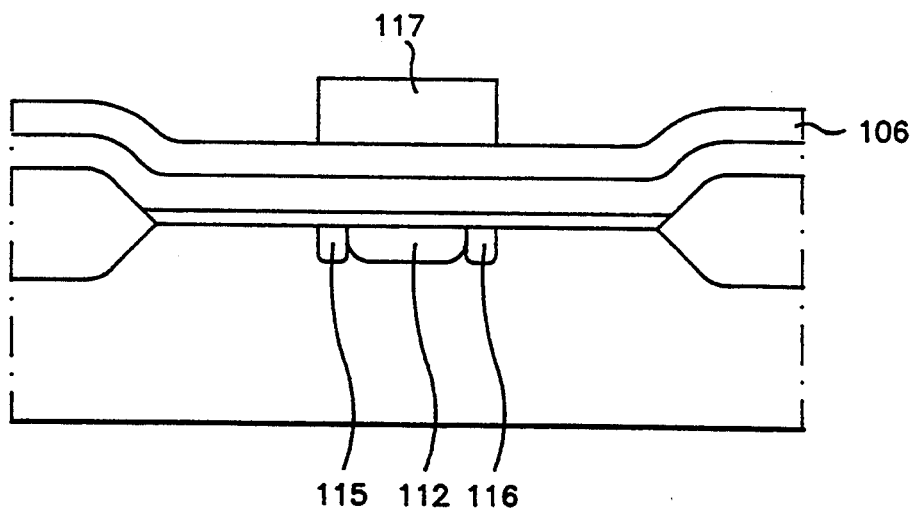

The insulating film 107 for mask is removed, leaving the second material layer 117 alone on the predetermined region of the oxide film 106, as shown in FIG. 3F.

Figure 3G:
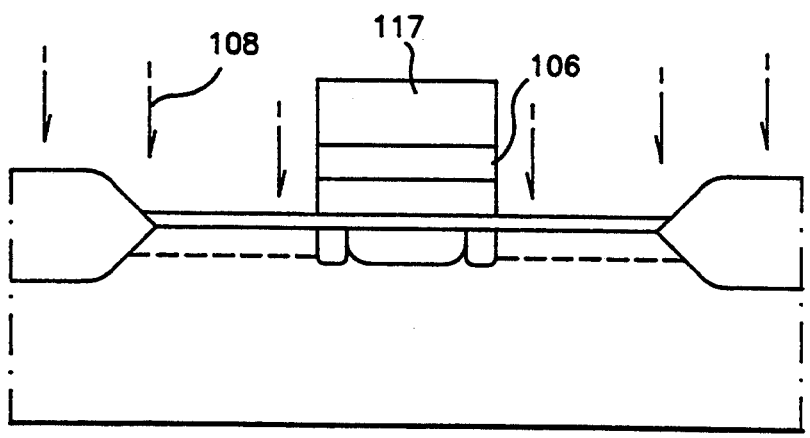
Figure 3H:
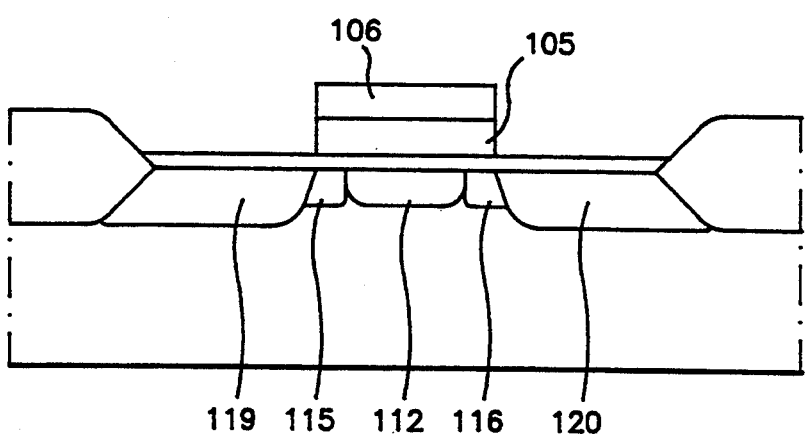

FIG. 3G shows an etch process and an ion implantation process. Using the second material layer 117 as a mask, the etch process is applied to the oxide film 106 and the polysilicon layer 105 to remove all portions but the portion masked. As a result, a gate cap oxide film 106' and a polysilicon gate 105' are formed. Thereafter, an n type impurity such as phosphorous or arsenic is ion-implanted at a high density in the semiconductor substrate through the gate insulating film 103, as indicated by arrow 118 of FIG. 3G.

As a result of the ion-implantation of n type impurity, an n+ source region 119 and an n+ drain region 120 are formed in the semiconductor substrate. Finally, the second material 117 serving as a photoresist is removed so as to form an LDD gate transistor.

Though the preferred embodiment of the present invention is confined to a p type substrate transistor for convenience, the method according to the present invention can be applied to other type transistor. For example, in case of CMOS transistor, an LDD region of p− region and a p+ source and drain region can be formed in an n well region formed in a p type substrate by the method according to the present invention. In addition, an n type substrate transistor comprising an LDD region of n− region and an n+ source and drain region in a p well region formed in an n type substrate may be also fabricated by the method described above.

In accordance with the present invention, the LDD regions of the n− region 115 and 116 are formed in such a way to completely overlap the polysilicon gate 105' so that the immunity for hot carrier can be improved, resulting in the prevention of device degradation.

In addition, even though the gate according to the present invention has not an inverse-T type structure but a conventional single layer structure, the inventive transistor demonstrates the same operational characteristics that the ITLDD gate transistor does. Accordingly, the flatness of device can be much improved in accordance with the present invention.

The gate cap oxide film 106' formed on the gate 105' plays a role in preventing a channeling phenomenon.

Since a photolithograph process is not employed to form a gate in the inventive method, there is not generated a problem such as alignment. Further, the gate pattern is formed by an etch process, so that the side surface of the gate can be formed clearly and precisely in accordance with the present invention.

Figure 2A:
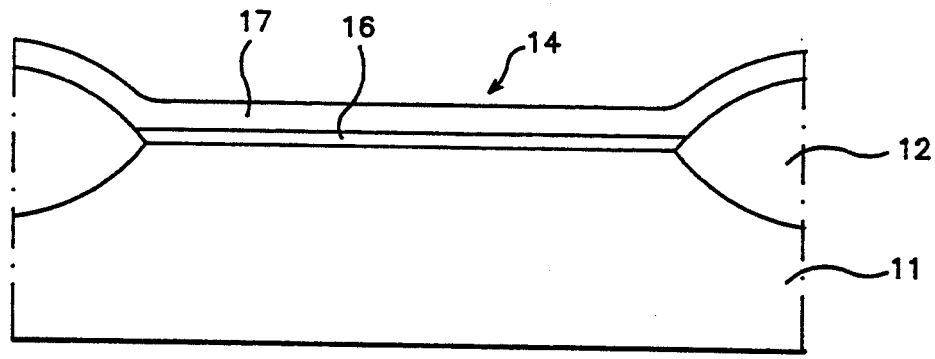
FIGS. 2A through 2F are schematic cross sectional views illustrating process steps in fabrication of another conventional ITLDD gate device, in summary.
Figure 2B:
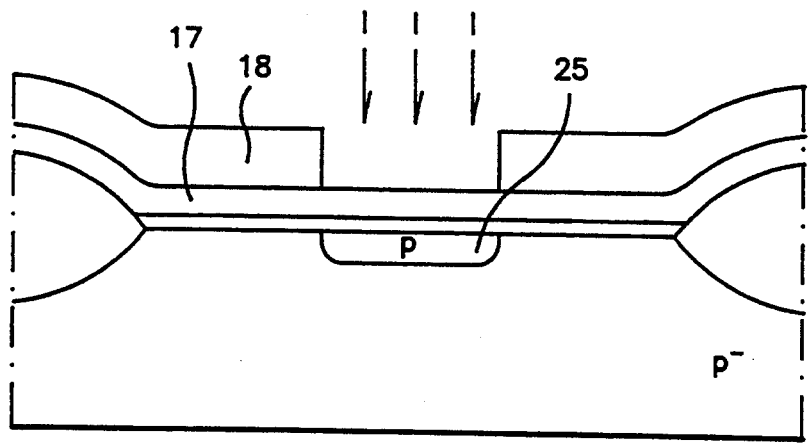
Figure 2C:
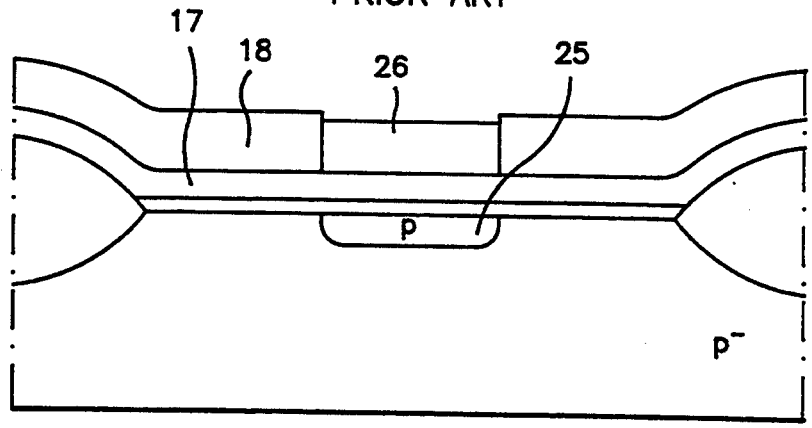
Figure 2D:
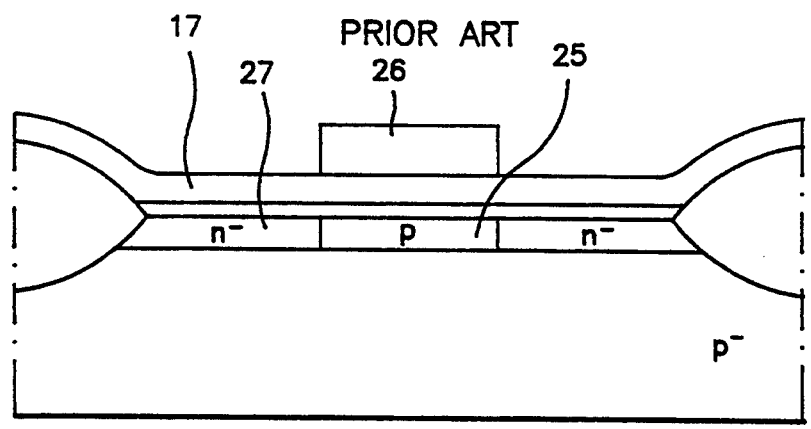
Figure 2E:
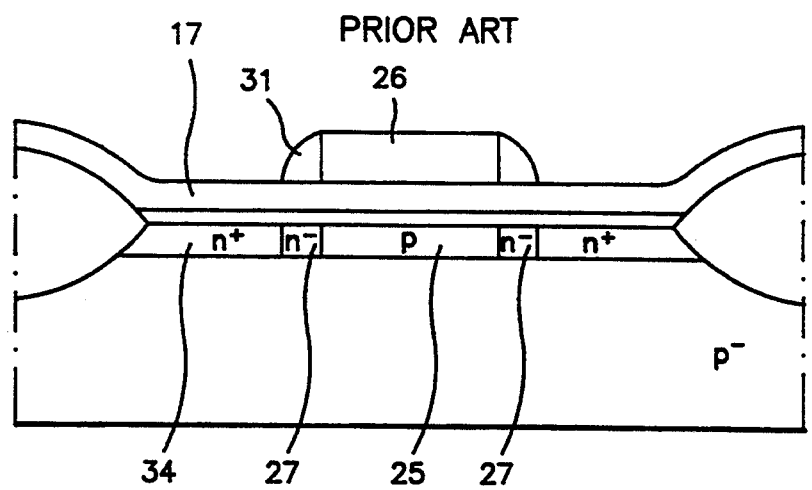
Figure 2F:
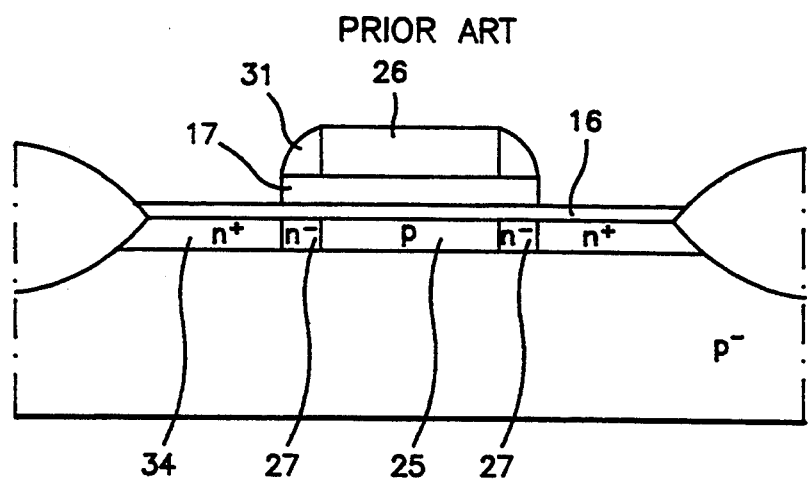

The inventive method also has such an advantage that the width of gate is defined thereby in contrast to the conventional method in which the width of gate may be varied by the width of spacers (refer to FIGS. 2E and 2F).

Consequently, as described hereinbefore, the transistor fabricated by the method according to the present invention can be improved in characteristics such as operational ability and switching time.

What is claimed is:

1. A method for fabricating a transistor device, comprising of the steps of:

forming a gate insulating film over a first conductive semiconductor substrate;
   covering said gate insulating film with a gate layer and an insulating film for gate cap, in due order;
   forming an insulating film for mask over said insulating film for gate cap;
   applying an etch process to said insulating film for mask to remove a portion of said insulating film for mask;
   forming a pair of spacers at both sides of the etched portion of said insulating film for mask;
   implanting first conductive impurity ions;
   depositing a first material layer in the etched portion of said insulating film for mask;
   removing said spacers;
   implanting second impurity ions at a low density to form two lightly doped regions in the semiconductor substrate;
   removing said first material;
   depositing a second material layer in the etched portion of said insulating film for mask, again;
   removing said insulating film for mask;
   applying an etch process to said insulating film for gate cap and said gate layer by use of said second material layer as a mask to form a gate cap insulating film and a gate; and
   implanting a second conductive impurity ions at a high density to form a high density source region and a high density drain region.

2. A method according to claim 1, wherein said gate is formed of polysilicon.

3. A method according to claim 1, wherein said gate is formed by depositing polysilicon and silicide, in due order.

4. A method according to claim 1, wherein said gate cap insulating film is formed of an oxide film.

5. A method according to claim 1, wherein materials constituting said insulating film for mask and said gate cap insulating film are different from each other.

6. A method according to claim 1, wherein materials constituting said spacers and said insulating film for mask are different from each other.

7. A method according to claim 1, wherein said insulating film for mask and said spacers are formed of a nitride film and polysilicon, respectively.

8. A method according to claim 1, wherein said insulating film for mask and said spacers are formed of polysilicon and a nitride film, respectively.

9. A method according to claim 1, wherein said first material layer is formed of a material different from materials for said gate cap insulating film, said insulating film for mask and said spacers.

10. A method according to claim 1, wherein said second material layer is formed of a material different from materials for said gate cap insulating film and said insulating film.

11. A method according to claim 9, wherein said first material layer and said second material layer serve as photoresists.

12. A method according to claim 1, wherein said step of implanting said first conductive impurity ions is carried out in order to control a threshold voltage.

13. A method according to claim 1, which further comprises the step of implanting impurity ions in order to form a punch through stop region after said step of implanting said first conductive impurity ions.

14. A method according to claim 1, wherein said first conductive semiconductor substrate is a p type semiconductor substrate.

15. A method according to claim 1, wherein said first conductive semiconductor substrate is a p type semiconductor substrate having an n well therein.

16. A method according to claim 1, wherein said first conductive semiconductor substrate is an n type semiconductor substrate.

17. A method according to claim 1, wherein said first conductive semiconductor substrate is a p type semiconductor substrate having a p well therein.

* * * * *